(12) United States Patent
Easter et al.

(10) Patent No.: US 6,368,190 B1
(45) Date of Patent: Apr. 9, 2002

(54) ELECTROCHEMICAL MECHANICAL PLANARIZATION APPARATUS AND METHOD

(75) Inventors: William G. Easter; John A. Maze, III; Frank Miceli, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/491,836

(22) Filed: Jan. 26, 2000

(51) Int. Cl.[7] ................................................. B24B 1/00
(52) U.S. Cl. ............................ 451/41; 451/36; 451/287
(58) Field of Search ............................... 451/5, 36, 75, 451/41, 287, 288

(56) References Cited

U.S. PATENT DOCUMENTS

| | | | | |
|---|---|---|---|---|
| 5,575,706 A | * | 11/1996 | Tsai et al. | 451/36 X |
| 5,597,442 A | * | 1/1997 | Chen et al. | 451/287 X |
| 5,624,300 A | * | 4/1997 | Kishii et al. | 451/36 |
| 5,647,792 A | * | 7/1997 | Katsuoka et al. | 451/287 X |
| 5,827,114 A | * | 10/1998 | Yam et al. | 451/75 |
| 5,911,619 A | | 6/1999 | Uzoh et al. | |

* cited by examiner

*Primary Examiner*—Joseph J. Hail, III
*Assistant Examiner*—Anthony Ojini

(57) ABSTRACT

An apparatus for the electrochemical mechanical planarization of semiconductor wafers includes a rotatable platen and a polishing pad disposed on the platen. The polishing pad has top and bottom surfaces. A wafer carrier is disposed proximate to the platen for pressing a semiconductor wafer against the platen. At least one carrier electrode is disposed on the carrier and is adapted to electrically connect an electrically conducting surface of the semiconductor wafer to an electrolytic circuit including a potential source. A platen electrode is operatively connected to the platen. The platen electrode electrically connects an electrolytic solution disposed on the polishing pad to the potential source and to the electrode on the wafer carrier to complete the electrolytic circuit. The platen electrode has a substantially circular circumference for discharging electrons into the electrolytic solution. The platen electrode is substantially devoid of portions under the bottom surface of the polishing pad.

12 Claims, 2 Drawing Sheets

US 6,368,190 B1

ELECTROCHEMICAL MECHANICAL PLANARIZATION APPARATUS AND METHOD

CROSS-REFERENCE TO RELATED APPLICATIONS (Not Applicable)

STATEMENT REGARDING FEDERALLY SPONSORED RESEARCH OR DEVELOPMENT (Not Applicable)

BACKGROUND OF THE INVENTION

1. Field of the Invention

This invention relates generally to the field of semiconductor wafer fabrication, and more particularly to the field of electrochemical mechanical planarization (ECMP) of thin films used in semiconductor wafer fabrication.

2. Description of the Related Art

The production of integrated circuits begins with the creation of high quality semiconductor wafers. A semiconductor wafer typically includes a substrate, such as a silicon or gallium arsenide wafer, on which a plurality of transistors have been formed. Transistors are chemically and physically connected into a substrate by patterning regions in the substrate and layers on the substrate. The transistors are interconnected through the use of well known multilevel interconnects to form functional circuits. Typical multilevel interconnects are comprised of stacked thin films, with the interconnect layers consisting of one or more of the following: titanium (Ti), titanium nitrite (TiN), tantalum (Ta), aluminum-copper (Al—Cu), aluminum-silicon (Al—Si), copper (Cu), and tungsten (W).

During the wafer fabrication process, the wafers may undergo multiple masking, etching, dielectric deposition, and conductor deposition processes. An extremely flat, or planarized, surface is generally needed to ensure proper accuracy and performance of the photolithographic processes used in printing even smaller line widths. In general, a wafer can be polished to remove high typography, surface defects such as crystal lattice damage when polishing silicon or GaAs substrates, scratches, roughness or embedded particles. The polishing of metal interconnect layers is necessary to ensure that the metal is left only at the via or plug level, and is not overlying the surface so as to cause unwarranted electrical shorts. As the size of integrated circuits continues to decrease and the density of microstructures on an integrated circuit continues to increase, the need for more planar wafer surfaces becomes more important. Therefore, between each processing step, it is usually necessary to polish the surface of a wafer in order to obtain the most planarized surface possible.

CMP is routinely used to planarize the surface of the layers, or thin films, of the wafer during the various stages of device fabrication. CMP has emerged as the planarization method of choice because of its ability to planarize over longer lengths than traditional planarization methods. During a CMP process, polishing planarizes surfaces to very precise tolerances, which is essential for maintaining the precise photolithographic depth of focus required for integrated circuit chip fabrication. In a typical CMP process, the wafer is held by a rotating carrier with the active wafer surface facing a rotating polishing table, called a platen. On top of the platen is a porous polishing surface on which is poured a slurry. The slurry can be in an aqueous solution in which an abrasive such as colloidal silica is suspended. Slurries with different chemical compositions are used to polish metals and other films. During metal polishing, the slurry chemically reacts with the wafer's surface, forming a passive layer on a portion of the wafer's surface, while the mechanical force exerted by the pad and the abrasive particles abrades the wafer's surface, removing the passive layer.

A CMP slurry serves several functions. Most notably, it is the medium in which abrasive particles are dispersed. Additionally, it furnishes the chemical agents which promote the chemical process. To obtain optimum results from CMP processing, there must be a synergistic relationship between the chemical and mechanical processes.

For example, CMP slurries for polishing a metal layer commonly comprise a metal oxidizer and an abrasive agent. The oxidizer reacts with the metal to form a passive metal oxide layer. During the polishing process, the abrasive agent removes the passive oxide layer from elevated portions of the metal layer. Depressed portions of the metal layer surface are not subjected to mechanical abrasion and, therefore, the protected material underlying depressed portions of the passive oxide layer is not polished. This process continues until the elevated portions of the metal layer have been polished away, resulting in planarization.

The ideal polishing process can be described by Preston's equation: $R=K_p*P*V$, where R is the removal rate, P is the applied pressure between the wafer and the polishing surface, V is the relative velocity between the wafer and the polishing surface, and $K_p$ is a function of consumables such as polishing surface roughness, elasticity, and chemistry. The ideal CMP process has constant pressure between the polishing surface and the wafer, constant polishing surface roughness, elasticity, area, and abrasion effects, and constant velocity over the entire wafer surface.

It is known that the planarizing of a metal layer of a semiconductor wafer can be assisted by the use of an electrolytic polishing slurry in a process known as electrochemical mechanical planarization (ECMP). The metal layer of the semiconductor wafer, the slurry, and a suitable cathode are connected to a voltage potential such that metal ions are driven from the metal layer of the semiconductor wafer into the electrolytic solution. The metal ions either plate at the cathode or are washed away with the electrolytic solution. The control of system parameters, including the concentration of electrolyte in the electrolytic slurry and the voltage potential that is applied to the system, will affect the rate at which metal ions are removed from the metal layer. One such system is disclosed by Uzoh et al, U.S. Pat. No. 5,911,619. It is important to control the current density flowing through the metal layer of the semiconductor wafer, as differences in current density will result in uneven removal of metal ions from different portions of the metal layer. Also, such systems position the cathode beneath the polishing the pad. Gas which can form at the cathode can cause gas bubbles to form underneath the pad during the polishing process and result in uneven planarization.

SUMMARY OF THE INVENTION

An electrochemical mechanical planarization apparatus includes a rotatable platen and a polishing pad that is disposed on the platen and has top and bottom surfaces. A wafer carrier is disposed proximate to the platen and is adapted to hold a wafer against the platen. At least one carrier electrode is disposed on the carrier and is adapted to electrically connect an electrically conductive surface of the wafer held by the carrier to an electrolytic circuit. A platen electrode is operatively connected to the platen and is adapted to connect an electrolytic solution disposed on the polishing pad to the electrolytic circuit. The platen electrode has a substantially circular circumference for radially discharging current into the electrolytic solution. The cathode is substantially, and preferably totally, devoid of portions under the bottom surface of the polishing pad.

In one embodiment, the platen electrode is disposed on the platen around the circumference of the polishing pad. In another embodiment, the polishing pad is substantially ring shaped with an interior opening. The platen electrode is disposed on the platen within the interior opening of the polishing pad.

The platen electrode can also be provided in the polishing pad, which is positioned on the platen. The platen electrode can be provided as a circumferential portion of the polishing pad. In another embodiment, the polishing pad is substantially ring-shaped with an interior opening. The platen electrode is disposed in the polishing pad at a position bordering the interior opening.

BRIEF DESCRIPTION OF THE DRAWINGS

There are shown in the drawings embodiments which are presently preferred it being understood, however, that the invention is not limited to the precise arrangements and instrumentalities shown, wherein.

DETAILED DESCRIPTION OF THE PREFERRED EMBODIMENTS

Figure 1:
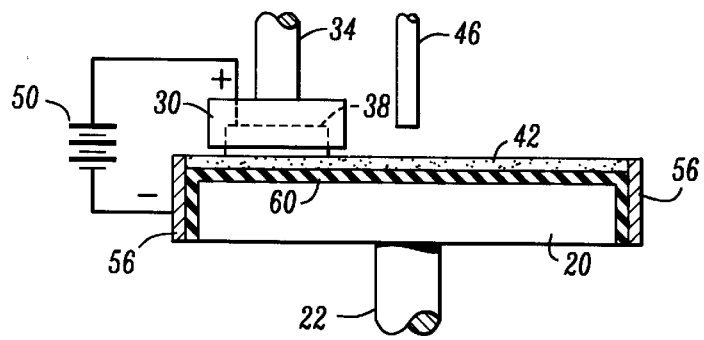
FIG. 1 is a schematic side elevation of an apparatus according to the invention.
Figure 2:
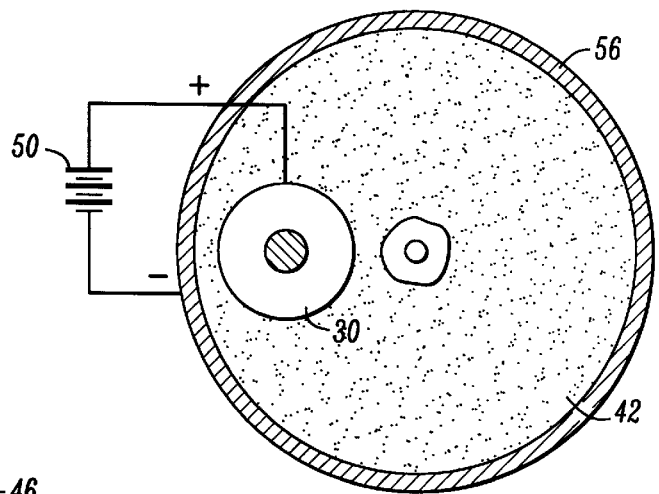
FIG. 2 is a plan view.

An apparatus according to the invention is shown in FIGS. 1–2. A platen 20 is rotatable and typically has a spindle 22 which is driven by a motor (not shown) to rotate the platen 20. A wafer carrier 30 is rotated by suitable structure such as a spindle 34 which is connected to a motor (not shown) that is adapted to rotate the spindle 34. Structure is also provided to apply a downward force on the wafer carrier 30 such that a semiconductor wafer 38 is pressed downward toward the platen 20. A polishing pad 42 is provided on the platen 20 for polishing the wafer 38. The polishing pad 42 can be of conventional construction, depending on the characteristics of the surface of the wafer 38 that is to be polished. A slurry supply nozzle 46 applies slurry from a source (not shown) to the surface of the polishing pad 42.

According to known ECMP procedures, the solution supplied to the outlet 46 includes at least one electrolyte that is selected for the particular metal which is being removed the wafer surface. In the case of a copper surface, the electrolyte is typically copper sulfate. A potential source 50 applied to the wafer carrier 30 and, by means of suitable electrical contacts, to the metal layer of the wafer 38 that is to be polished. The contacts can be made by suitable structure such as a connection to the wafer carrier 30, or a connection to the spindle 34 with a line running to the wafer carrier 30. The connection ultimately will be made with the metal surface of the wafer 38. In this manner, an electrical connection will be made between the source 50 and the metal surface of the wafer 38. At least one platen electrode 56 is operatively connected to the platen 20. The platen electrode 56 will typically be the cathode, and is adapted to complete an electrolytic circuit between the conductive layer of the wafer 38 that is to be polished, the electrolytic solution on the pad 42, and the source 50. The source 50 will thereby apply a potential to the metal surface of the wafer 38 which will drive metal ions into the electrolytic solution from the metal surface of the wafer 38.

As shown in FIG. 2, the electrode 56 can have a substantially circular perimeter. In one embodiment, the electrode 56 is provided on a circumferential portion of the platen 20. In this manner, current from the platen electrode 56 will flow radially inward from the electrode 56 such that there will be a more even current density across the surface of the polishing pad 40 than will usually be obtained where the platen electrodes are intermittently spaced apart around the circumference of the platen 20. Also, the platen electrode 56 preferably has no portion located beneath the bottom of the polishing pad 42, such that any gas bubbles developed at the electrode 56 will be released to the surrounding atmosphere and will not cause bubble formation under the pad 42. An insulative layer 60 can be provided between the outside surface of the platen 20 and the platen electrode 56, so as to electrically insulate the platen 20.

Figure 3:
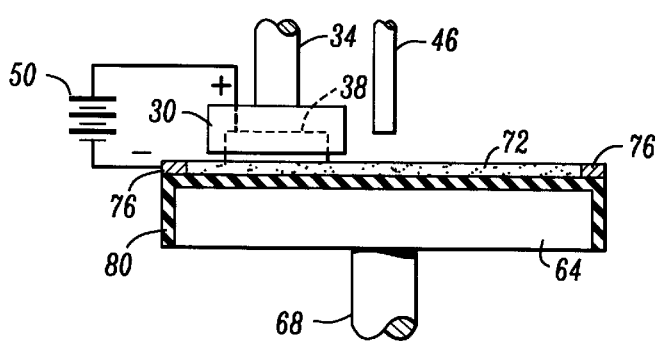
FIG. 3 is a schematic cross-section of a second embodiment.
Figure 4:
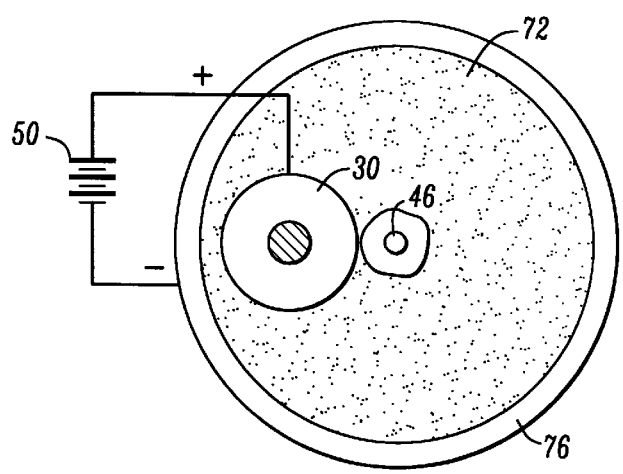
FIG. 4 is a plan view.

A second embodiment of the invention is depicted in FIGS. 3–4. In this embodiment the wafer carrier 30 is substantially as previously described and holds a wafer 38 with an electrically conductive surface that is to be polished. Electrodes in the wafer carrier 30 connect the conductive layer of the wafer 38 to a potential source 50. A platen 64 is rotatable by suitable structure such as a motor-driven spindle 68. A polishing pad 72 is provided on the platen 64. The polishing pad 72 in this embodiment has an outer circumferential portion 76 of a conductive material and is connected by suitable electrical contact structure to the potential source 50. Electrons will flow from the cathode 76 through the electrolyte slurry solution flowing over the pad 72 to the conductive layer of the wafer 38 that is being polished. Metal ions, such as copper ions, will be discharged from the surface of the wafer 38 into the electrolytic solution and will either be discharged with the electrolytic solution or will plate on the cathode 76. A layer of insulation 80 can be provided on the top and sides of the platen 64 in order to insulate the platen 64 from the electrolytic circuit.

Figure 5:
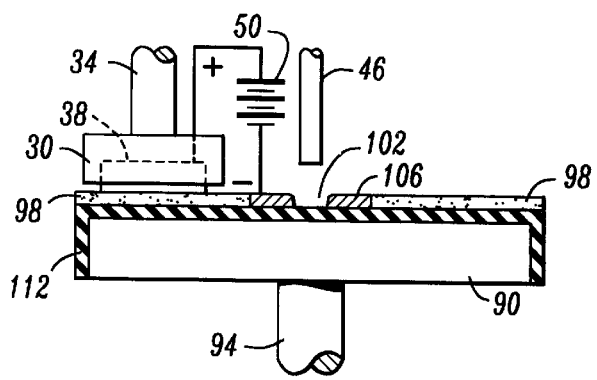
FIG. 5 is a cross-section of another alternative embodiment.
Figure 6:
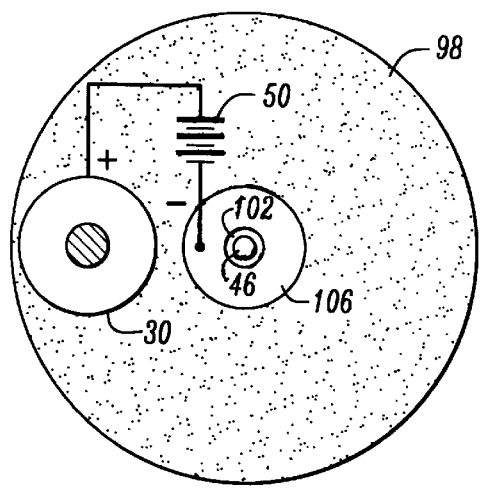
FIG. 6 is a plan view.

Another embodiment of the invention is shown in FIGS. 5–6. The platen 90 is rotated by suitable structure such as a motor-driven spindle 94. The wafer carrier 30 holds the wafer 38 with a conductive layer that is to be polished. Suitable electrodes in the wafer carrier 30 connect the conductive layer of the wafer 38 to the potential source 50. An electrolytic slurry is supplied through the outlet 46. A polishing pad 98 is provided on the platen 90. The polishing pad 98 has an interior opening 102 with a substantially circular perimeter. A conductive material 106 can be provided at a portion of the pad 98 which substantially borders the interior opening 102. Alternatively, the conductive material 106 can substantially fill the opening 102 in the pad material. A suitable electrical contact connects the conductive portion 106, which is seen to have a substantially circular shape, to the potential source 50. Slurry supplied through the outlet 46 completes the electrolytic circuit between the conductive portion 106 of the polishing pad 98 and the conductive layer of the wafer 38 on the wafer carrier 30, such than metal ions from the surface of the wafer 38 will be driven into the electrolytic solution on the polishing pad 98. An insulative portion 112 can be provided over the surface of the platen 90 in order to insulate the platen 90 from the electrolytic circuit.

Figure 7:
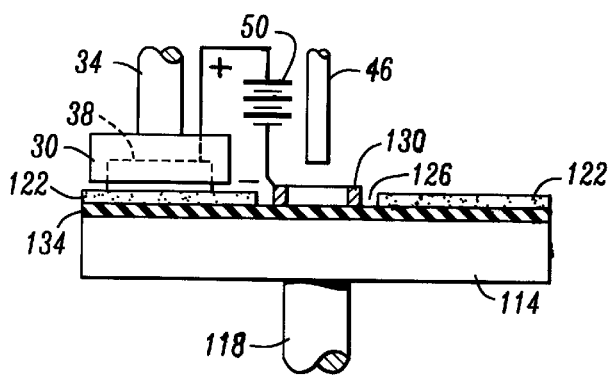
FIG. 7 is a schematic cross-section of still another embodiment.
Figure 8:
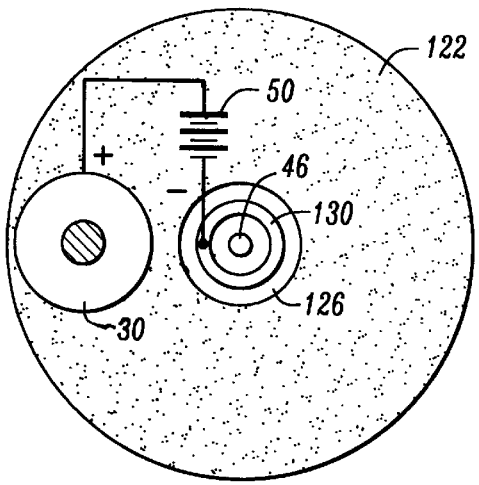
FIG. 8 is a plan view.

Another embodiment is shown in FIGS. 7–8. In this embodiment, a platen 114 is rotated by suitable structure, such as a motor-driven spindle 118. A wafer carrier 30 is provided to hold the wafer 38 with a conductive surface that is to be polished. Suitable electrical contact structure is provided to electrically connect the conductive layer of the wafer 38 to the potential source 50. Electrolytic solution is supplied through an outlet 46. A polishing pad 122 is provided on the surface of the platen 114. The polishing pad has an interior opening 126. A circular platen electrode 130 is disposed on the platen 140 within the opening 126 of the polishing pad 122. A suitable electrical contact is made between the platen electrode 130 and the source 50. The electrolytic slurry applied through the outlet 46 flows over the platen electrode 130 and completes the electrolytic circuit between the conductive layer of the wafer 38 and the platen electrode 130. An insulative portion 134 can be provided on a surface of the platen 114 in order to substantially insulate the platen 114 from the electrolytic circuit.

The characteristics of the electrolytic circuit will vary according to the nature of the conductive layer that must be polished. The selection of the electrolyte, its concentration, and the other components of the electrolytic solution can all be varied to suit the requirements of the planarization that must be performed. Similarly, the potential applied by the source 50 can be varied according to the requirements of the polishing process.

The invention is suitable for polishing a number of conductive layers commonly found on semiconductor wafers, including Cu, Al, Cu—Al, Cu—Al—Si, Ti, Ta, W, Fe, Ag, Au and alloys thereof. The potential can be adjusted so that the metal ions are removed from the wafer and plate on a portion of the cathode. The cathode portion on which the ions plate can be exchanged and discarded. In the embodiments where the cathode is provided as a part of the polishing pad, the cathode will be replaced each time the polishing pad is replaced. Alternatively, a maintenance procedure could be used in which a wafer of a suitable material is provided, the potential is reversed, and the cathode is rejuvenated. The potential of the source 50 can also be adjusted to dissolve the metal ions, but not to substantially plate the metal ions on the cathode. In this case, the ions would be washed away with the electrolytic solution and recovery of the metal ions would be performed in a separate process. The potential preferably provides a constant direct current output, however, other wave forms could be applied by the source 50, including some alternating current wave forms, for example, wave forms which have a larger forward ECMP component and a smaller reverse component to rejuvenate the cathode.

The electrolytic solution preferably will include a slurry of abrasive particles such as colloidal silica or other abrasives known in the art. The solution can also include one or more additives to facilitate the process. It is known that inhibitors such as benzotriazole (BTA) inhibit the removal of copper from the wafer surface. Such inhibitors can be added to the solution in order to facilitate the leveling process, since the inhibitors tend to accumulate in valleys on the wafer surface and high spots will be preferentially removed. Well known CMP oxidizing compounds such as $H_2O_2$ and $H_2SO_4$ will also be included in order to facilitate the ECMP process. It will be appreciated that the composition of the slurry in regards to abrasive concentration, electrolyte selection and concentration, inhibitor and oxidizer selection and concentration can also be varied over time in order to control the ECMP process as desired.

The polishing pad according to the invention can be constructed of well known materials and methods. The electrically conductive portions of the pad can be adhered or fixed to the appropriate portion of the pad by mechanical means or adhesives. It may also be possible to mold or otherwise embed the conductive portions into the pad during the pad fabrication process in portions of the pad that will not be used for polishing.

The invention can be embodied in other forms without departing from the spirit or essential attributes thereof, and accordingly, reference should be had to the following claims, rather than to the foregoing specification, as indicating the scope of the invention.

We claim:

1. An electrochemical mechanical planarization apparatus, comprising;
   a rotatable platen;
   a polishing pad disposed on said platen, said polishing pad having top and bottom surfaces;
   at least one outlet for supplying an electrolytic solution onto said polishing pad;
   at least one wafer carrier disposed proximate to said platen for placing a wafer against said platen;
   at least one carrier electrode disposed on said carrier that electrically connects an electrically conductive surface of said wafer to an electrolytic circuit; and
   a platen electrode operatively connected to said platen that electrically connects said electrolytic solution disposed on said polishing pad to said electrolytic circuit, said platen electrode having a substantially circular circumference for discharging electrons into said electrolytic solution, said platen electrode being devoid of portions under said bottom surface of said pad.

2. The apparatus of claim 1, wherein said platen electrode is disposed around the circumference of said platen.

3. The apparatus of claim 1, wherein said platen electrode is provided as a circumferential portion of said polishing pad.

4. The apparatus of claim 1, further comprising an insulative layer on said platen for electrically isolating said platen from said electrolytic circuit.

5. The apparatus of claim 1, wherein said platen electrode comprises copper.

6. The apparatus of claim 1, wherein said electrolytic solution comprises abrasive particles and copper sulfate.

7. The apparatus of claim 1, wherein said electrolytic solution comprises at least one inhibitor.

8. A method for polishing semiconductor wafers, comprising the steps of:
   placing a wafer with a metal surface on a carrier having a carrier electrode adapted to make an electrical connection to said metal surface;
   electrically connecting said carrier electrode to a potential source;
   placing the wafer against a polishing pad on a platen, said platen having at least one platen electrode with a substantially circular perimeter and being substantially devoid of portions under said polishing pad; and
   flowing an electrolytic solution over said polishing pad, said electrolytic solution completing an electrolytic circuit between said metal surface, said carrier electrode, said potential source and said platen electrode.

9. The method of claim 8, wherein said platen electrode is disposed around the circumference of said platen.

10. The method of claim 8, wherein said platen electrode is provided as a circumferential portion of said polishing pad.

11. The method of claim 8, further comprising the step of rotating at least one of said wafer carrier and said platen.

12. A polishing pad for electrochemical mechanical planarization, comprising a substantially planar polishing pad body portion having top and bottom surfaces, and a conductive electrode portion having a substantially circular circumference, substantially none of said conductive electrode portion being under said bottom surface of said polishing pad body portion.

* * * * *